(12) United States Patent
Namba et al.

(10) Patent No.: US 6,669,434 B2
(45) Date of Patent: Dec. 30, 2003

(54) DOUBLE ARM SUBSTRATE TRANSPORT UNIT

(75) Inventors: Hirotoshi Namba, Ibara (JP); Takahiro Kobiki, Ibara (JP)

(73) Assignee: Tazmo Co., Ltd., Okayama (JP)

( * ) Notice: Subject to any disclaimer, the term of this patent is extended or adjusted under 35 U.S.C. 154(b) by 0 days.

(21) Appl. No.: 09/988,959

(22) Filed: Nov. 16, 2001

(65) Prior Publication Data

US 2002/0066330 A1 Jun. 6, 2002

(30) Foreign Application Priority Data

Nov. 17, 2000 (JP) ........................................ 2000-351463

(51) Int. Cl.⁷ .............................................. B66C 23/00
(52) U.S. Cl. .................................. 414/744.5; 414/744.1
(58) Field of Search ............................. 414/744.5, 941, 414/936, 222.09, 226.01, 226.04, 744.1, 744.4; 901/15, 8

(56) References Cited

U.S. PATENT DOCUMENTS

| 5,007,784 | A |   | 4/1991  | Genov et al. |
|-----------|---|---|---------|--------------|
| 5,049,029 | A |   | 9/1991  | Mitsui et al. |
| 5,064,340 | A |   | 11/1991 | Genov et al. |
| 5,443,354 | A |   | 8/1995  | Stone et al. |
| 5,525,027 | A |   | 6/1996  | Jinno et al. |
| 5,534,761 | A |   | 7/1996  | Crippa |
| 5,584,647 | A | * | 12/1996 | Uehara et al. ............ 414/744.5 |
| 5,640,883 | A |   | 6/1997  | Takizawa |
| 5,771,748 | A |   | 6/1998  | Genov et al. |
| 5,775,170 | A |   | 7/1998  | Genov et al. |
| 5,789,890 | A |   | 8/1998  | Genov et al. |
| 5,839,322 | A |   | 11/1998 | Genov et al. |
| 5,857,826 | A |   | 1/1999  | Sato et al. |
| 6,121,743 | A |   | 9/2000  | Genov et al. |
| 6,155,768 | A | * | 12/2000 | Bacchi et al. ............ 414/744.5 |
| 6,199,444 | B1 |  | 3/2001  | Wakaizumi et al. |
| 6,481,956 | B1 | * | 11/2002 | Hofmeister ............... 414/744.5 |

FOREIGN PATENT DOCUMENTS

| JP | 08-274140 | 10/1996 |
|----|-----------|---------|
| JP | 9-285982  | 11/1997 |

\* cited by examiner

Primary Examiner—Eileen D. Lillis
Assistant Examiner—Michael Lowe
(74) Attorney, Agent, or Firm—Jordan and Hamburg LLP

(57) ABSTRACT

A double arm substrate transport unit for transporting a work piece, such as a semiconductor wafer, includes a robotic arm formed of a first forearm supported by the tip part of a base arm so as to be freely rotatable. A first end effector on which a work piece is placed is supported by the tip part of the first forearm so as to be freely rotatable. A second forearm is supported by the tip part of the base arm so as to be freely rotatable is attached above the first forearm so as to overlap the first forearm. A second end effector on which a work piece is placed is supported by the tip part of the second forearm so as to be freely rotatable.

9 Claims, 9 Drawing Sheets

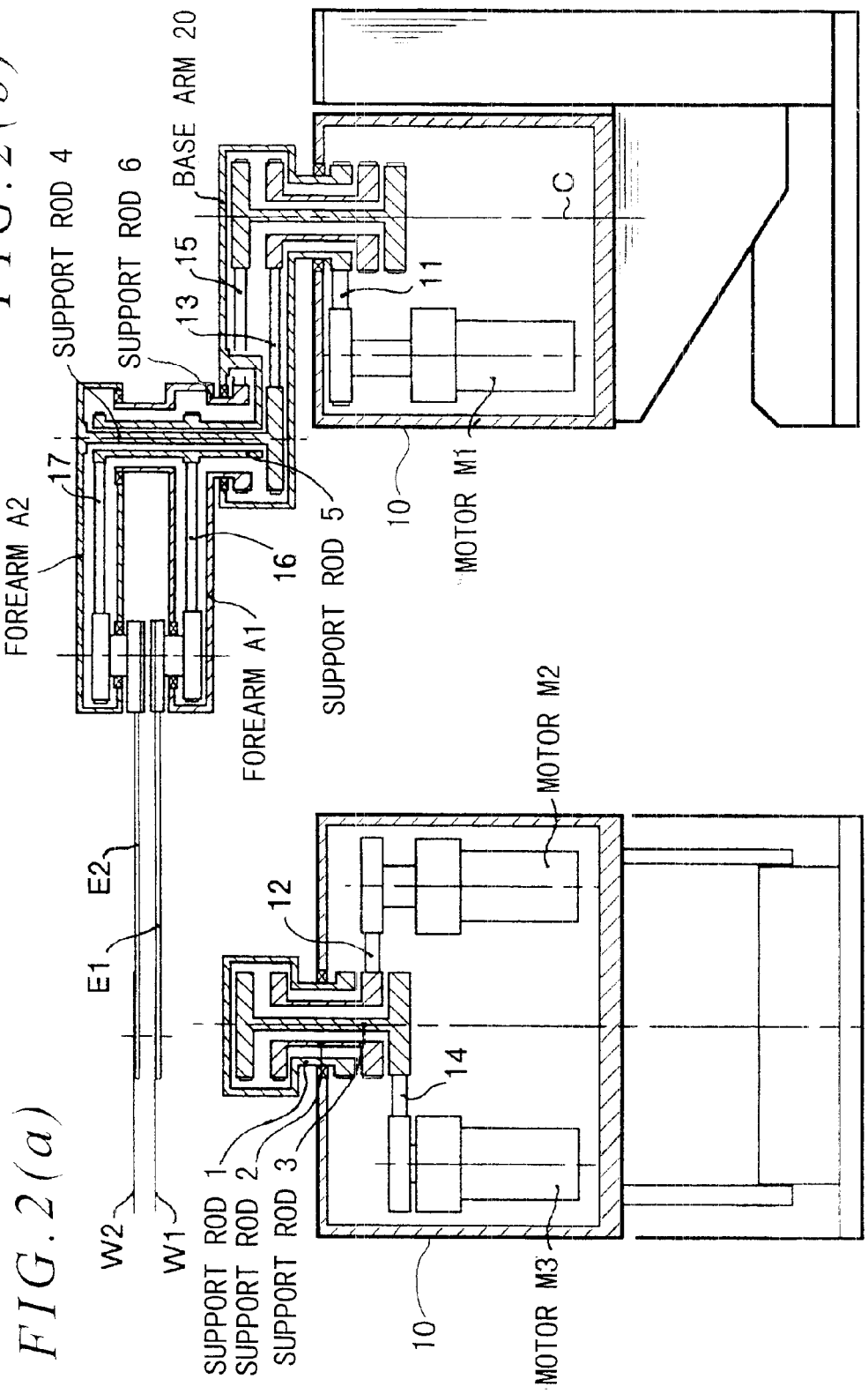

DOUBLE ARM SUBSTRATE TRANSPORT UNIT

BACKGROUND OF THE INVENTION

The present invention relates to a substrate transport unit for transporting a work piece such as a semiconductor wafer, a substrate for a photomask or a glass substrate for a liquid crystal display by using a double armed robotic hand.

Conventionally, a substrate transport unit is known wherein two robotic hands are provided on a base so that a replacement operation of work pieces, such as semiconductor wafers, substrates for photomasks or glass substrates for liquid crystal displays is possible in a short period of time (see, for example, Japanese unexamined patent publication No.8-274140). In this type of substrate transport unit, two base arms are formed in positions symmetric to each other, with one on the left and the other on the right, and are offset from the center of the robot so that the work pieces, which are transport objects, are shifted through the operation of these arms.

At this time, the tip parts of the right and left arms are offset to the right and left having a plane including the center line of the substrate transport unit as a symmetrical plane and since the minimum rotational radius of the robot, including a work piece to be transported, becomes significantly large in the case that end effectors are directly attached to tip parts of these arms, U-shaped bars that are directed to the symmetrical plane from the tip parts of the right and left hands of the substrate transport unit are provided and end effectors are attached to these U-shaped bars so that a structure is provided wherein a work piece can be placed. In addition, these U-shaped bars vary in dimension according to the size of a work piece to be transported in order to prevent the work pieces placed on the respective end effectors from interfering with each other at the time of arm extension or contraction.

In order to increase productivity, a clean transport unit that is compact and of which the transport time is short is in demand wherein as great a distance as possible is maintained between the part to be processed, such as a substrate, and a robot, which is a transport part, and wherein the unit is designed so as to save space. At the same time, an increase in reproducibility of repetitive transport and in mechanical rigidity at the time of operation is required for advanced microscopic processing and, therefore, these problems have become the focus of development.

In the above described conventional substrate transport unit, however, as shown in FIGS. 3(b) and 4, base arms B1 and B2 are formed in positions that are offset from the center of the unit and are symmetrical on the right and left. Therefore, the end effectors E1 and E2 above the base arms that extend to the right and left have, in some cases, different assembly errors on the right and left sides at the stage of manufacture and, therefore, the level standard of the end effectors E1 and E2 may differ. In addition, since the end effectors E1 and E2 are separated on the right and the left, a sidewise U-shaped bar B is provided in order to prevent interference between a work piece W, which is transported in an up and down direction, and an end effector. Therefore, such a U-shaped bar B lowers precision and rigidity.

SUMMARY OF THE INVENTION

The present invention is provided to solve these problems and an object thereof is to provide a double arm substrate transport unit that is a substrate transport unit for transporting a work piece, such as a semiconductor wafer, and wherein it becomes possible to eliminate a U-shaped bar by forming first and second forearms extending from the tip part of a base arm and, in addition, it becomes possible to reduce the number of parts and to reduce the total weight of the unit in comparison with a conventional substrate transport unit, wherein two base arms exist, one on the right side and the other on the left side.

In order to achieve the above object, the present invention provides a substrate transport unit for transporting a work piece, such as a semiconductor wafer, a substrate for photomask or a glass substrate for a liquid crystal display, by using a robotic hand that is formed of:

a base arm (20) that is supported by the base so as to rotate freely as shown in FIGS. 1, 2, and the like;

a forearm (A1) that is supported by the tip part of this base arm (20) so as to rotate freely;

an end effector (E1) that is supported by the tip part of this forearm (A1) so as to rotate freely and on which a work piece is placed;

a forearm (A2) that is supported by the tip part of the base arm (20) so as to rotate freely and that is attached above the forearm (A1) so as to overlap the forearm (A1); and an end effector (E2) that is supported by the tip part of this forearm (A2) so as to rotate freely and on which a work piece is placed.

According to the present invention, the forearm (A1) and the forearm (A2) are formed above the base arm (20) and, therefore, the U-shaped bar (B), which is required in a conventional substrate transport unit shown in FIGS. 3(b) and 4, becomes unnecessary. Therefore, the mechanical precision of the forearm (A1) and of the forearm (A2) is primarily determined by the mechanical precision of the tip part of the base arm (20) so that the reproducibility, with respect to mechanical precision, of the forearm (A1) and the reproducibility of the forearm (A2) are of approximately the same values and it becomes possible to maintain the transport reproducibility of work pieces (W1) and (W2), which are placed on respective end effectors (E1) and (E2), at a high reproducibility.

In addition, as is seen by comparing FIG. 3(a) and FIG. 3(b), though the minimum rotational radius of the substrate transport unit of the present invention is R265 (mm), which is the same as of the conventional unit, the stretch stroke when the arm extends becomes st585 (mm), in comparison with st480 (mm) of the conventional unit, so that 20% of the stroke extension is achieved. Furthermore, though the forearms are formed to be symmetrical on the right and left side in the conventional unit so that the absolute volume occupied by the unit and the area as seen from above become large, all of the forearms and the base arm are put together on one side of the center line, as seen from above, of the unit of the present invention so that the freedom of the design layout becomes great of surrounding equipment when the unit of the present invention is utilized. Furthermore, the total number of components can be reduced so as to achieve a reduction in weight.

Furthermore, in the above structure according to the present invention, the forearm (A1) and the forearm (A2) have the same arm length, share a common rotational axis above the base arm (20) and are independently rotatable in planes of which the height positions are different from each other. Thereby, the arm becomes rotatable with a small radius so that a compact transport unit can be implemented.

In the above structure according to the present invention, three independent motors are provided in a box placed in the lower part of the unit that is formed of transmission means such that a motor (M1) rotates the base arm (20), a motor (M2) rotates the forearm (A2) and a motor (M3) rotates the forearm (A1). Thereby, three independent motors are driven in synchronization or independently so that it becomes possible to carry out the operation of which the movements are shown in operational diagrams (A) through (E) of FIG. 5, wherein the motor (M1) drives the base arm (20), the motor (M2) drives the forearm (A2) and the motor (M3) drives the forearm (A1) so as to have an operation of which the freedom is high due to the transmission method.

In the above structure according to the present invention, in response to one driving mode of the motors, the forearm (A1) moves backward or forward and the forearm (A2) carries out a circular movement having the rotational axis of the base arm (20) as the center. In response to another driving mode of the motors, the forearm (A2) may go backward or forward and the forearm (A1) may carry out a circular movement having the rotational axis of the base arm (20) as the center. Thereby, it becomes possible to move the end effector (E1) and the end effector (E2) backward or forward in a straight manner to or from the position where a work piece is given or received so that a replacement operation of work pieces becomes possible.

In the above structure according to the present invention, the robotic hand can, in response to a driving mode of the motors, rotate in an arbitrary rotational direction having the base arm rotational axis as the center while maintaining the angle formed by the base arm (20) and the forearm (A1) and the angle formed by the base arm (20) and the forearm (A2). Thereby, a rotational movement of the robotic hand becomes possible so that it becomes possible to freely arrange the position where a work piece is given or received relative to the substrate transport unit.

In the above structure according to the present invention, by making the motor (M1) and the motor (M2) or the motor (M3) rotate asynchronously, a work piece placed on the end effector (E1) or on the end effector (E2) may be moved within the targeted transport range by passing through an arbitrary track. For example, by rotating the motor (M2) or the motor (M3) while the motor (M1) is stopped, a work piece placed on the end effector (E1) or on the end effector (E2) is shifted backward or forward through a predetermined arc track. Thereby, in the case that there is an obstacle between the place where a work piece is given or received and the transport unit body, the arm is shifted so as to avoid the obstacle before the work piece placed on the end effector (E1) or on the end effector (E2) can be shifted to the place where the work piece is given or received.

In the above structure according to the present invention, the motor (M2) and the motor (M3) may be rotated synchronously in the same direction while the motor (M1) may be rotated asynchronously to, or in the direction opposite to, the rotational direction of the motor (M2) and the motor (M3) and, thereby, a work piece placed on the end effector (E1) and a work piece placed on the end effector (E2) can be simultaneously transported between the standby position and the position where a work piece is given or received. Thereby, it becomes possible to simultaneously transfer work pieces (W1) and (W2) by making the interval between the absorption surfaces of the respective end effectors (E1) and (E2) equal to the pitch between the slots of cassettes into which work pieces are loaded so that the transport throughput can be increased.

In the double arm substrate transport unit formed as described above according to the present invention, the motors may be provided along the rotational axes of the respective arms and end effectors so that the arms and the end effectors, respectively, are freely rotatable. Thereby, since it is possible to freely rotate each joint, it becomes possible to implement a greater variety of transport tracks.

BRIEF DESCRIPTION OF THE DRAWINGS

FIG. 2(a) is a front cross sectional view of the lower portion of the unit of FIG. 1 and FIG. 2(b) is a side cross sectional view of the entirety of the unit of FIG. 1.

FIGS. 5(A) to 5(E) are plan views showing movements of an operation of the substrate transport unit according to the present embodiment, wherein FIG. 5(A) is a view showing the standby condition, FIG. 5(B-1) is a view showing the condition where end effector E2 starts to extend, FIG. 5(C-1) is a view showing the condition wherein end effector E2 has extended to the position where a work piece is given and received, FIG. 5(B-2) is a view showing the condition where end effector E1 starts to extend, FIG. 5(C-2) is a view showing the condition where end effector E1 has extended to the position where a work piece is given and received, FIG. 5(D) is a view showing a track of work piece W2 and FIG. 5(E) is a view showing a track of work piece W1.

DETAILED DESCRIPTION OF THE PREFERRED EMBODIMENT OF THE PRESENT INVENTION

Figure 1:
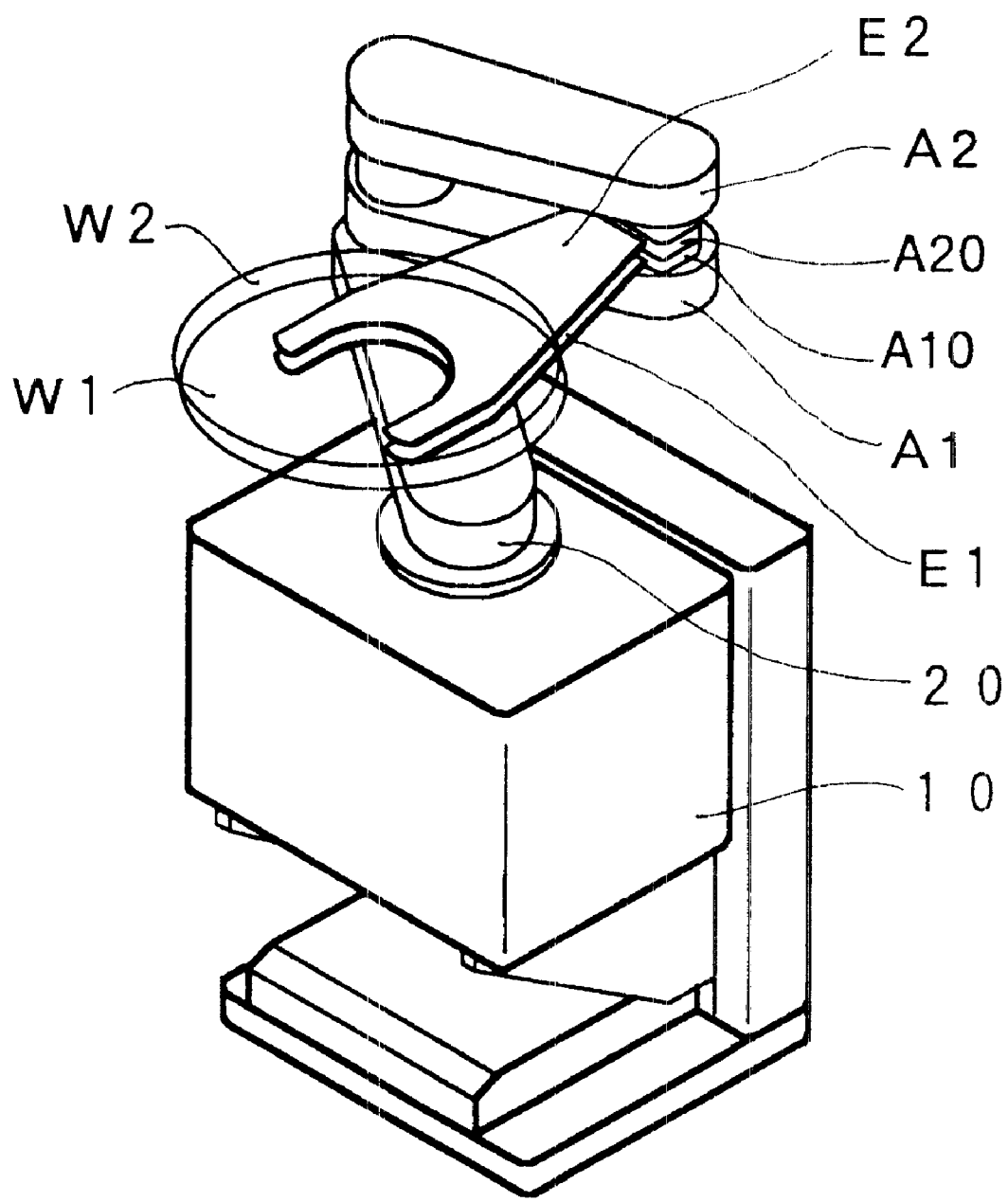
FIG. 1 is a perspective view of a substrate transport unit according to one embodiment of the present invention.
Figure 3A:
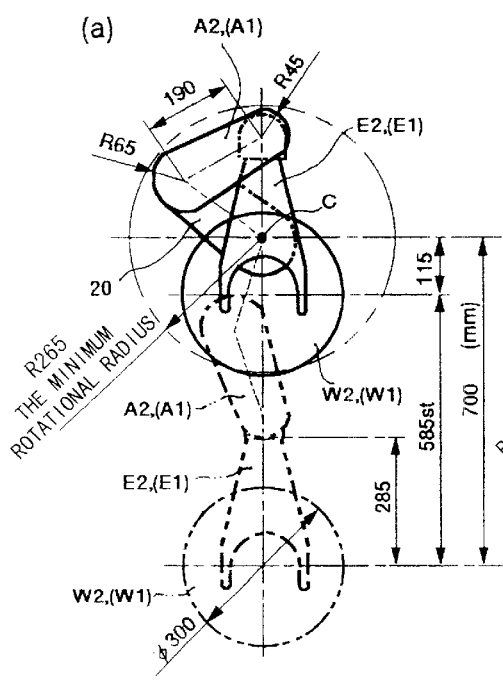
FIG. 3(a) is a plan view of a substrate transport unit according to one embodiment of the present invention and FIG. 3(b) is a plan view of a substrate transport unit according to a prior art.
Figure 3B:
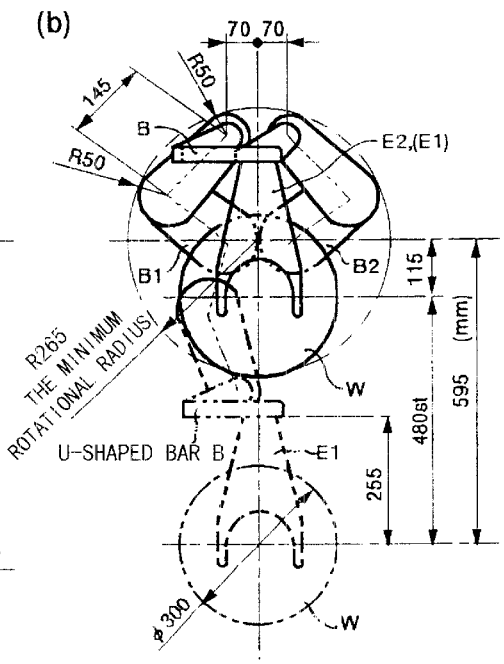
Figure 4:
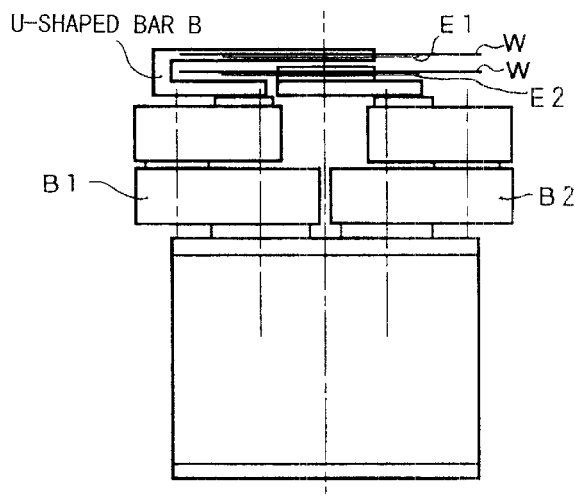
FIG. 4 is a front view of the substrate transport unit according to the prior art.

A double arm substrate transport unit according to one embodiment of the present invention is described in reference to the figures. In FIGS. 1, 2 and 3(a) a substrate transport unit is formed of a base 10 placed in the lower portion of the unit of which the inside is equipped with a driving source and formed of a robotic hand that is supported by this base 10 so as to be freely rotatable and that can extend and contract. The robotic hand is formed of a base arm 20 of which the base part is supported by the base 10 so as to be freely rotatable, of forearms A2 and A1 (second and first forearms) supported by the tip part of this base arm 20 so as to share a common rotational axis and so as to be freely rotatable in positions overlapping in the vertical direction and end effectors E1 and E2 (first and second end effectors) fixed to arms A20 and A10 that are supported by respective tip parts of these forearms A2 and A1 so as to be freely rotatable and on which work pieces W1 and W2 to be transported are placed. The distances between the rotational axes of the forearm A2 and the base arm 20 as well as between the rotational axes of the forearm A1 and the base arm 20 are set at the same length.

The driving source, which is located inside of the base 10, is made up of three independent motors M1, M2 and M3 (first, second and third motors). The motor M1 is placed in a position that is offset from the base arm rotational axis C so as to convey the torque to a hollow support rod 1 (a first support rod), which becomes the central axis to which the base arm 20 is attached, via a transmission means 11 and rotates the base arm 20. Furthermore, the torque of this motor M1 is conveyed to a part to which a hollow support rod 5 (a fifth support rod), that is attached to the tip of the base arm 20, is attached and is conveyed from the tip of this hollow support rod 5 to the part to which the end effector E2 is attached via a transmission means 17 (a fourth transmission means) and at the same time is conveyed from the mid part of the hollow support rod 5 to the part to which the end effector E1 is attached via a transmission means 16 (a third transmission means).

The motor M2 is placed at a position that is offset from the base arm rotational axis C and conveys the torque, via a transmission means 12, to a hollow support rod 2 (a second support rod) that is provided within the hollow support rod 1 so as to have the same axis as the base arm rotational axis C, which is then conveyed to a support rod 4 (a fourth support rod) provided within the hollow support rod 5, that is fixed to and has the same axis as the rotational axis of the forearm A2, via a transmission means 13 (a first transmission means) provided within the base arm 20 so as to rotate the forearm A2.

The motor M3 is placed at a position that is offset from the base arm rotational axis C and conveys the torque, via a transmission means 14, to a support rod 3 (a third support rod) provided within the hollow support rod 2 so as to have the same axis as the base arm rotational axis C, which is conveyed to a hollow support rod 6 (a sixth support rod), that is fixed to and has the same axis as the rotational axis of the forearms A1 and A2, via a transmission means 15 (a second transmission means) provided within the base arm 20 so as to rotate the forearm A1.

In addition, the above described hollow support rod 5 connected to the tip of the base arm 20 is provided so as to have the same axis as the rotational axis of the forearms A1 and A2 and so as to have the above described support rod 4 at the center. The transmission means 16 is formed so as to convey the rotation that creates the rotational speed ratio of 1:2 of the hollow support rod 5 to the end effector E1, and the transmission means 17 is formed so as to convey the rotation that creates the rotational speed ratio of 1:2 of the hollow support rod 5 to the end effector E2. The transmission means 11 to 17 may be formed of pulleys fixed to the rotational axes and belts put around the pulleys.

The above described transmission means 11 is a means for conveying the axial output of the motor M1 to the base arm 20 through the support rod 1. The transmission means 12 is a means for conveying the axial output of the motor M2 to the hollow support rod 2 provided having the same axis as the rotational axis of the base arm 20. The transmission means 13 is a means for conveying the output provided by the transmission means 12 to the support rod 4, provided within the base arm 20, that is fixed to and has the same axis as the rotational axis of the forearm A2. The transmission means 14 is a means for conveying the axial output of the motor M3 to the support rod 3 within the hollow support rod 1, which is utilized by the transmission means 12 provided having the same axis as the rotational axis of the base arm 20. The transmission means 15 is a means for conveying the output provided by the transmission means 14 to the hollow support rod 6 provided within the base arm 20 so as to have the same axis as the rotational axis of the forearms A1 and A2 in order to have the support rod 4 as the center. The transmission means 16 is a means for conveying the rotation to the forearm A1 and the rotational axis of the end effector in the support rod 5 having the support rod 4 as the center. Then the transmission means 17 is a means for conveying the rotation from the support rod 4 to the forearm A2 and the rotational axis of the end effector.

Next, working effects of the substrate transport unit formed as described above according to the present mode are described. As shown in FIG. 3(a), the minimum rotational radius of the robotic arm having the base arm rotational axis C as the center is R265 (mm), which is the same as in the prior art, and the stretch stroke (stretch status is shown with a broken line) at the time when the robotic arm moves forward from the position of standby to the position wherein a work piece is given or received becomes longer than that of the conventional unit so that the stroke extension, that is to say, the distance of transporting a work piece can be made longer.

In addition, since all of the forearms and the base arm are collected in one side of the unit from the center line according to the present embodiment in comparison with the conventional unit and, therefore, the unit becomes compact and has a high freedom in the layout and furthermore, the number of components is reduced so as to achieve cost reduction and reduction of the weight of the unit. In addition, though the unit is a double arm type, a U-shaped bar is not necessary, unlike in the conventional unit, so that the interference of the end effectors can be prevented and, since the U-shaped bar is not used, improvement in precision and rigidity can be achieved as described above.

Figure 5:
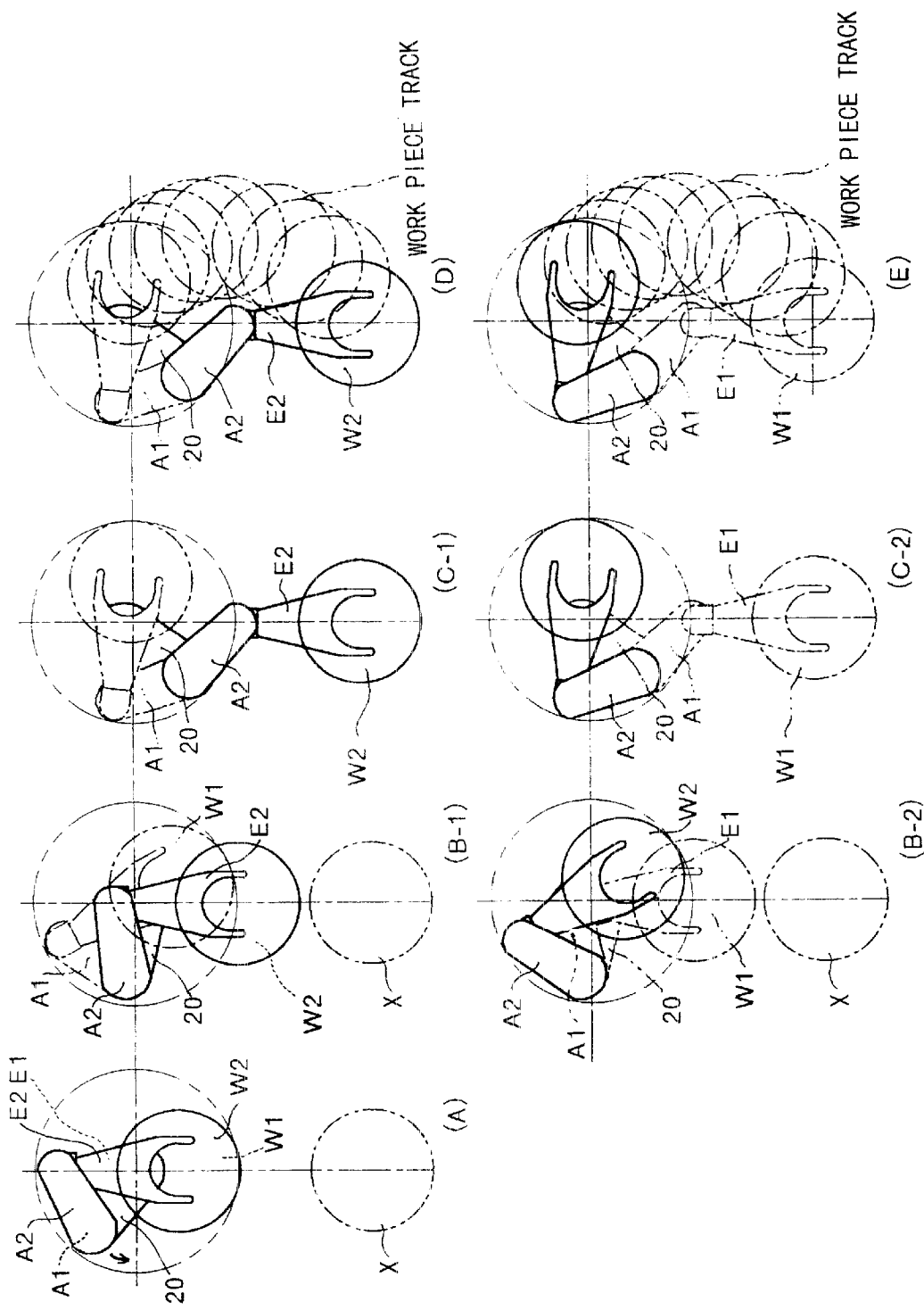

An operation of the substrate transport unit according to the present embodiment is shown in the plan views of FIGS. 5(A) to 5(E). In the figures, the forearm A2, the end effector E2 and a work piece W2 are shown with solid lines while the forearm A1, the end effector E1 and a work piece W1 are shown with double dotted chain lines. FIG. 5(A) shows the standby condition, FIG. 5(B-1) shows the condition wherein the end effector E2 begins to extend from the condition of FIG. 5(A) and FIG. 5(C-1) shows the condition wherein the end effector E2 has extended to the position X where a work piece is given or received. This operation is carried out through the rotations of the base arm 20, the forearm A2 and the end effector E2.

FIG. 5(B-2) shows the condition wherein the end effector E1 begins to extend from the condition of FIG. 5(A) and FIG. 5(C-2) shows the condition wherein the end effector E1 has extended to the position X where a work piece is given or received. This operation is carried out through the rotations of the base arm 20, the forearm A1 and the end effector E1.

FIG. 5(D) shows a track of a work piece W2 at the time when the base arm 20 of the present unit is fixed and the forearm A2 is rotated. FIG. 5(E) shows a track of a work piece W1 at the time when the base arm 20 of the present unit is fixed and the forearm A1 is rotated. In FIGS. 5(D) and 5(E) work pieces can be moved so as to follow a track of a predetermined arc. In the case that there is an obstacle between a position X where a work piece is given or received and the transport unit body, the arm is shifted so as to avoid the obstacle and can transport the work pieces W1 and W2 placed on the end effectors E1 and E2 to the position X where a work piece W1 or W2 is given or received.

The present unit comprises a control means for individually controlling and driving the three motors M1, M2 and M3 and the operation as described above is carried out through motor driving by this control means.

Figure 6:
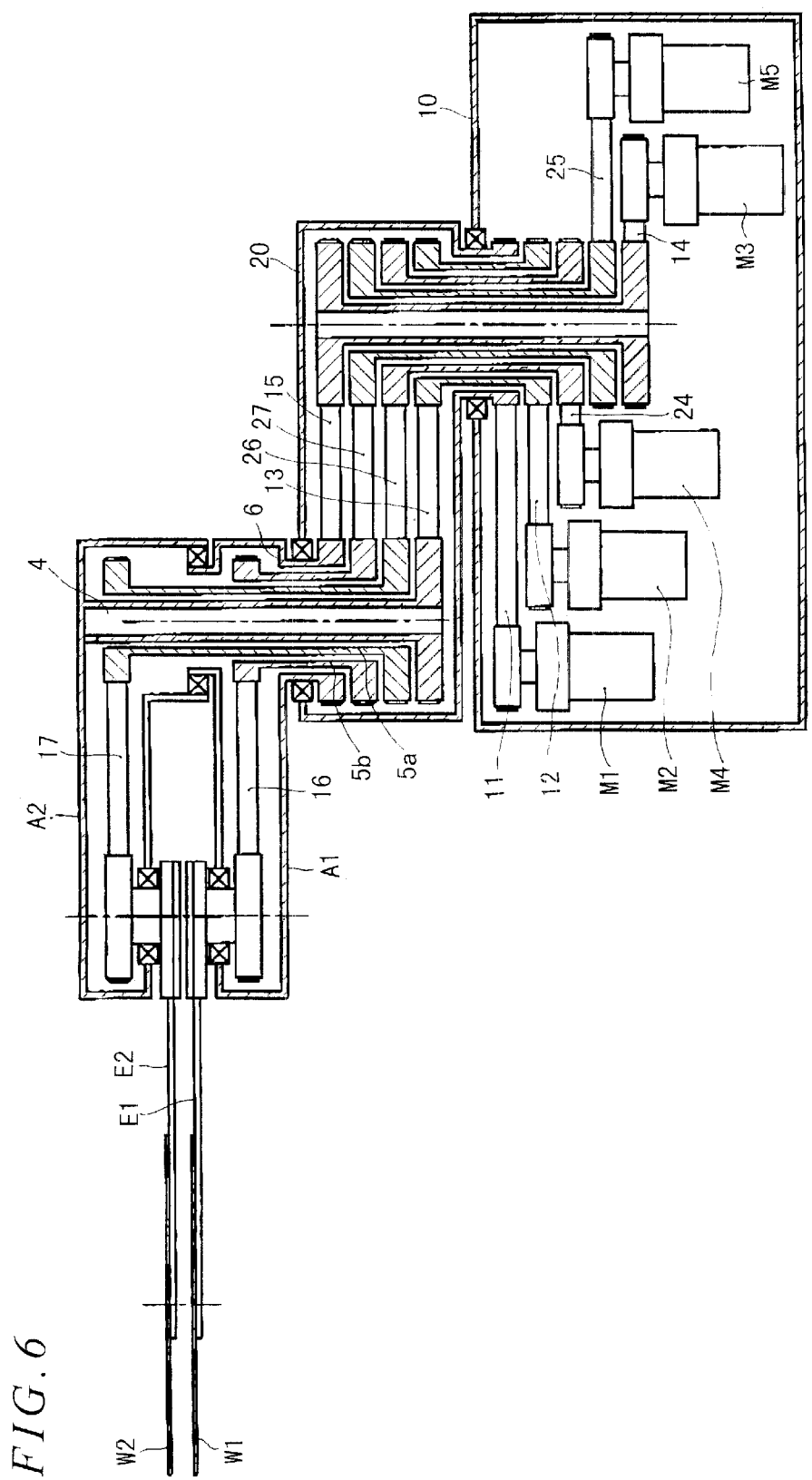
FIG. 6 is a cross sectional view of a substrate transport unit according to another embodiment of the present invention.

Next, another embodiment of the present invention is described. In the above described embodiment a plurality of cassettes, or the like, for giving or receiving work pieces are arranged so as to be aligned in a lateral direction at a position apart from the rotational axis of the robot hand wherein, at the time when the robot accesses these cassettes and inserts a work piece into each of the cassettes, the end effector alone cannot be individually turned around and, therefore, the track of the work piece cannot be made in a straight line (insertion from the direction perpendicular to the column direction) other than in the case wherein the cassettes are directly in front of the unit. FIG. 6 shows an embodiment wherein the track of a work piece can be made in a straight line in the case as described above. In the unit of this embodiment, motors M4 and M5, transmission means 24, 25, 26 and 27 for conveying the drive of the motors and the support rods 5a and 5b are additionally provided in order to allow the end effectors E1 and E2 to be individually rotatable. In FIG. 6, the same numbers are attached to the same components as in FIG. 2.

Figure 7:
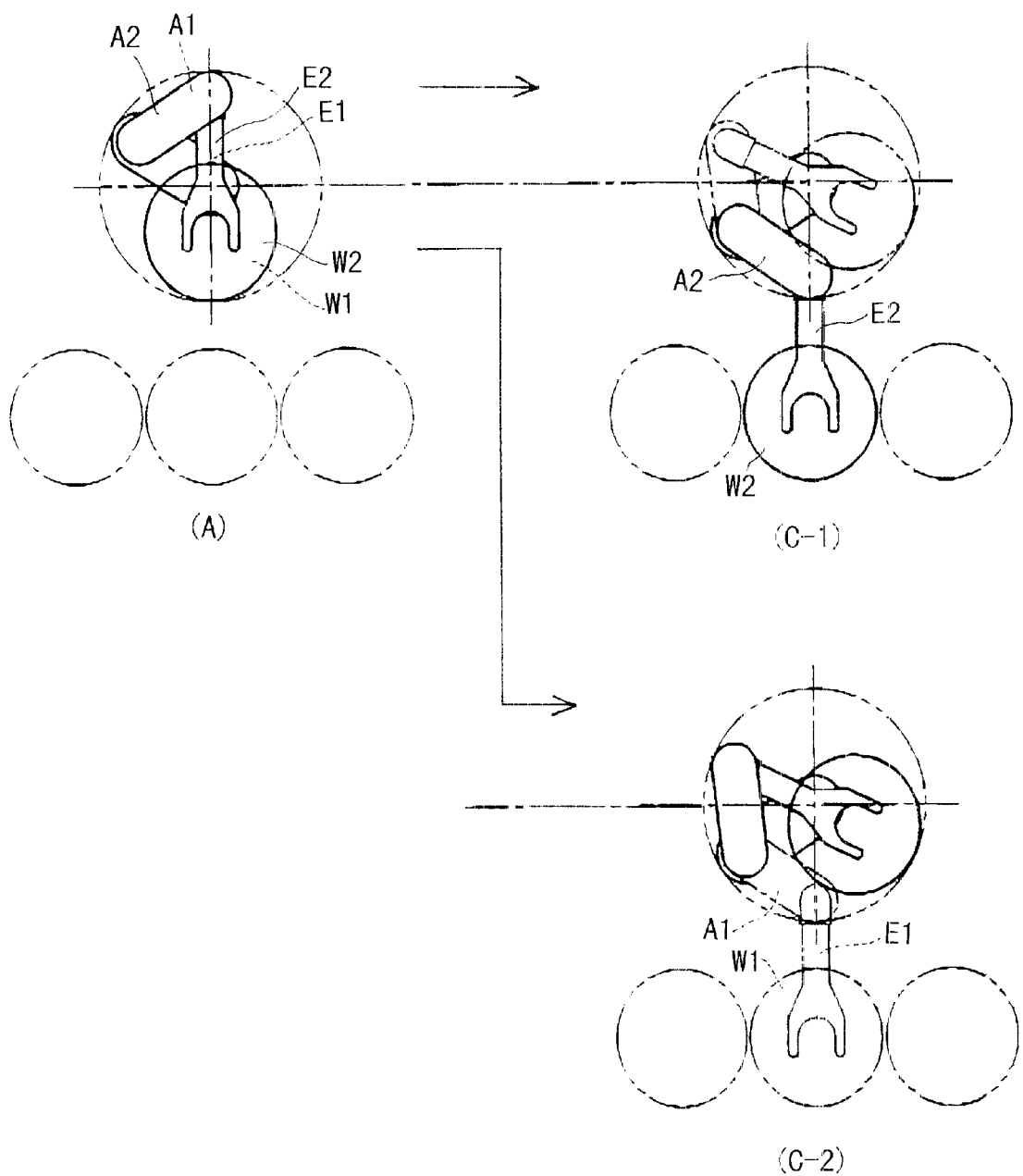
FIG. 7 shows movements of an operation of the unit of FIG. 6 when end effectors E2 and E1 respectively access a position that is directly in front of the unit where a work piece is given or received from among aligned cassettes.
Figure 8:
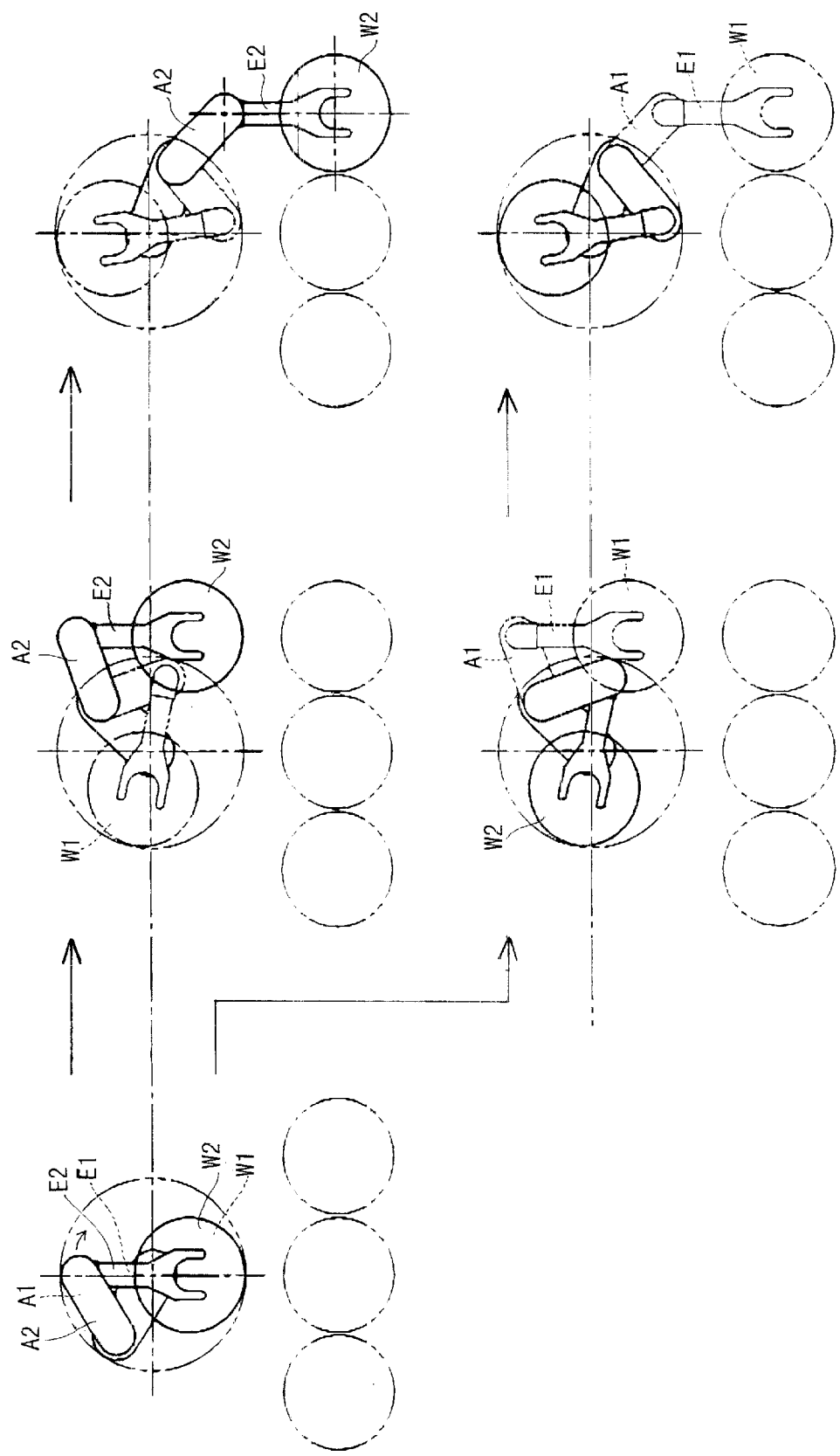
FIG. 8 shows transitions of end effectors E2 and E1 respectively accessing the position, on the right side of the drawings from among the aligned cassettes, where a work piece is given or received.
Figure 9:
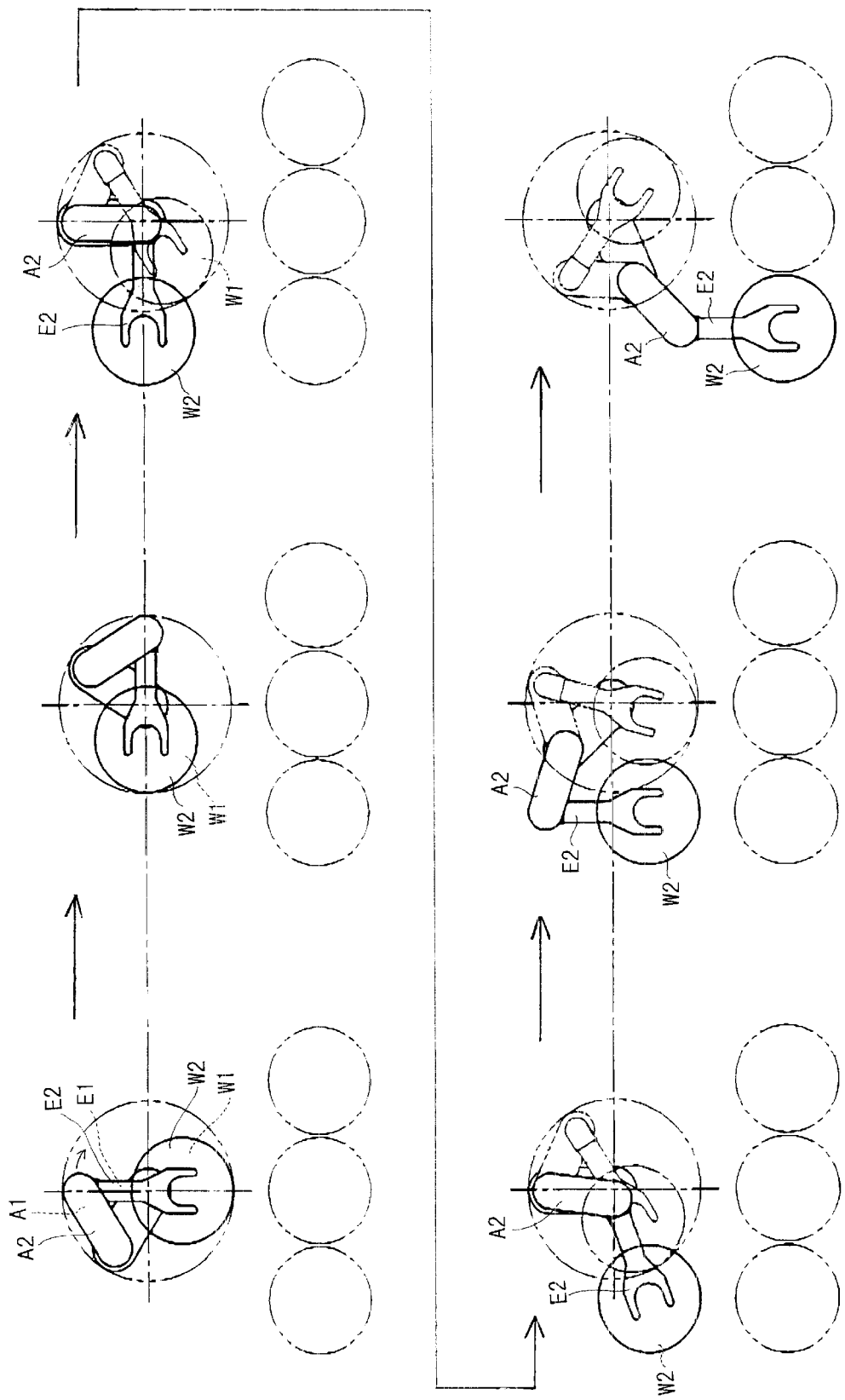
FIG. 9 is a view showing transitions of end effector E2 accessing the position, on the left side of the drawings from among the aligned cassettes, where a work piece is given or received.
Figure 10:
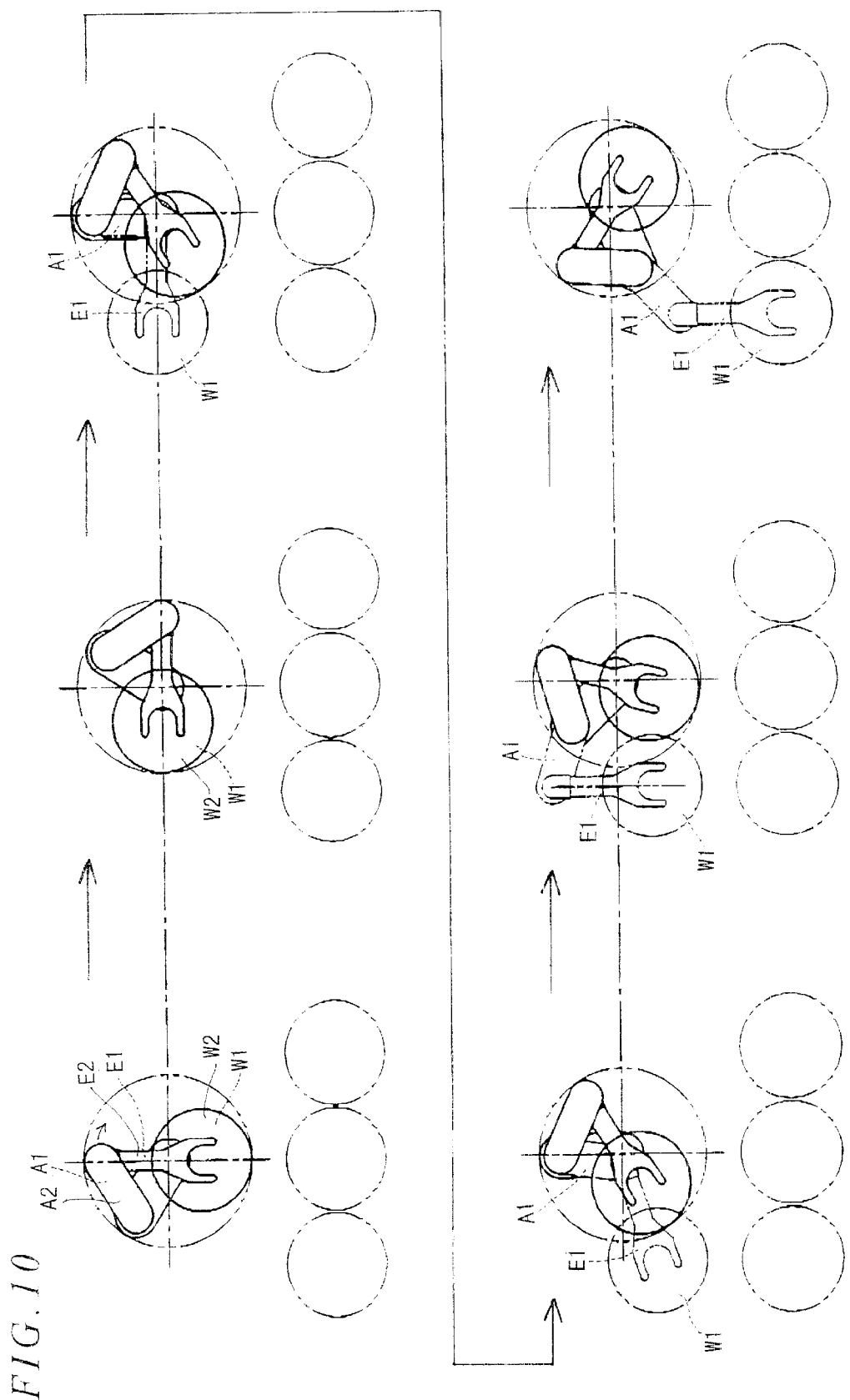
FIG. 10 is a view showing transitions of end effector E1 accessing the position, on the left side of the drawings from among the aligned cassettes, where a work piece is given or received.

FIGS. 7 to 10 show an operation of the robotic hand according to the embodiment of FIG. 6. FIG. 7 shows end effectors E2 and E1, respectively, accessing the position that is directly in front of the unit wherein a work piece is given or received from among the aligned cassettes. The condition of FIG. 7(A) becomes of the condition of FIG. 7(C-1) or of the condition of FIG. 7(C-2). This operation is the same as of the case as the above described FIG. 5. FIG. 8 shows the transitions of the end effectors E2 and E1 respectively accessing the position, on the right side of the drawings from among the aligned cassettes, where a work piece is given or received. FIGS. 9 and 10 show transitions of the end effectors E2 and E1 respectively accessing the position, on the left side of the drawings from among the aligned cassettes, where a work piece is given or received. Thus, the track of a work piece with respect to each of the plurality of positions where a work piece is given or received can be made in a straight line.

In addition, though in either of the above described embodiments the structure is shown wherein motors are provided in the base and the powers of the motors are conveyed to respective arm rotational axes via belts, the motors may be directly connected to the rotational axes and the present invention includes such a structure.

Here, the present invention is not limited to the structures of the above described embodiments but, rather, a variety of modifications are possible within the range wherein the subject of the invention is unchanged. In addition, as for the environment where the robot is utilized, utilization in a vacuum, in addition to utilization in the air, is possible.

What is claimed is:

1. A double arm substrate transport unit for transporting a work piece, comprising:
    a base arm supported by a base so as to be freely rotatable;
    a first forearm supported by a tip part of said base arm so as to be freely rotatable;
    a first end effector on which a work piece is placeable, said first end effector being supported by a tip part of the first forearm so as to be freely rotatable;
    a second forearm supported by the tip part of the base arm so as to be freely rotatable, said second forearm being attached to said base arm above the first forearm; and
    a second end effector on which a work piece is placeable, said second end effector being supported by a tip part of the second forearm so as to be freely rotatable.

2. The double arm substrate transport unit according to claim 1, wherein the first forearm and the second forearm have a same arm length, share a common rotational axis above the base arm and are independently rotatable in planes at different height positions.

3. The double arm substrate transport unit according to claim 2, further comprising motors connected to rotational axes of respective arms and the end effectors.

4. A double arm substrate transport unit for transporting a work piece, comprising:
    a base;
    a base arm supported by the base so as to be freely rotatable;
    a first forearm supported by a tip part of said base arm so as to be freely rotatable;
    a first end effector on which a work piece is placeable, said first end effector being supported by a tip part of the first forearm so as to be freely rotatable;
    a second forearm supported by the tip part of the base arm so as to be freely rotatable, said second forearm being attached to said base arm above the first forearm; and
    a second end effector on which a work piece is placeable, said second end effector being supported by a tip part of the second forearm so as to be freely rotatable; and
    three independent motors being disposed within the base placed in the lower portion of the unit,
    said first motor being provided so as to rotate a first support rod that serves as a rotational axis of the base arm,
    said second motor being provided so as to rotate a second support rod having a same axis as the rotational axis of the base arm such that torque is conveyed to a fourth support rod integrally fixed to the second forearm via a first transmission means provided within the base arm and, thereby, rotates the second forearm, the fourth support rod being provided within a fifth support rod that is hollow, that has a same axis as a rotational axis of the second forearm and that is fixed to the base arm so as to be non-rotatable,
    said third motor being provided so as to rotate a third support rod provided within the second support rod so that the torque is conveyed to a sixth support rod integrally fixed to the first forearm via a second transmission means provided within the base arm and, thereby, rotates the first forearm, the sixth support rod having a same axis as the rotational axis of the first and second forearms,
    a third transmission means being provided within the first forearm so that the fifth support rod that is hollow and the rotational axis of the first end effector convey rotations of which the rotational speed ratio is 1:2, the fifth support rod that is hollow being provided at the tip part of the base arm so as to have a same axis as the rotational axis of the first and second forearms in order to have the fourth support rod as the center, and a fourth transmission means being provided within the second forearm so that the fifth support rod that is hollow and the rotational axis of the second end effector convey rotations of which the rotational speed ratio is 1:2.

5. The double arm substrate transport unit according to claim 4, further comprising control means for controlling the first, second and third motors, said control means being operable to rotate and synchronize the first and second motors in the same direction and to rotate the third motor in a direction opposite to the direction in which the first and second motors rotate at the same rotational speed as that of the first and second motors, whereby a work piece placed on the tip of the first end effector translates in a direction radiating from the base arm rotational axis and, at the same time, a work piece placed on the tip of the second end effector moves around a circle of which the center is on the base arm rotational axis so as to be transported in a direction radiated from the base arm rotational axis.

6. The double arm substrate transport unit according to claim 4, further comprising control means for controlling the first, second and third motors, said control means being operable to rotate and synchronize the first and third motors in the same direction and to rotate the second motor in a direction opposite to the direction in which the first and third motors rotate at the same rotational speed as that of the first and third motors, whereby a work piece placed on the tip of the second end effector translates in a direction radiating from the base arm rotational axis and, at the same time, a work piece placed on the tip of the first end effector moves around a circle of which the center is on the base arm rotational axis so as to be transported in a direction radiated from the base arm rotational axis.

7. The double arm substrate transport unit according to claim 4, further comprising control means for controlling the first, second and third motors, said control means being operable to rotate and synchronize the first, second and third motors in the same direction, whereby the first and second end effectors become rotatable in an arbitrary rotational direction having the base arm rotational axis as the center while maintaining the angles formed by the base arm and the first and second forearms.

8. The double arm substrate transport unit according to claim 4, further comprising control means for controlling the first, second and third motors, said control means being operable to control the first motor and the second or third motor to rotate in an asynchronous manner, whereby a work piece placed on the first end effector or the second end effector is moved to a targeted transport position through an arbitrary track.

9. The double arm substrate transport unit according to claim 4, further comprising control means for controlling the first, second and third motors, said control means being operable to control the second and the third motors to synchronize and to rotate in the same direction and to control the first motor to rotate in a direction opposite to the direction in which the second and the third motors rotate or in an asynchronous manner with the rotation of the second and third motors, whereby a work piece placed on the first end effector and a work piece placed on the second end effector are transported through the same track in different planes.

* * * * *